May 12, 1959 HUNG C. LIN 2,886,653

AMPLITUDE MODULATED OSCILLATOR SYSTEMS

Filed Aug. 31, 1953 2 Sheets-Sheet 1

INVENTOR.
Hung C. Lin

BY H. C. Newton

ATTORNEY

May 12, 1959 HUNG C. LIN 2,886,653

AMPLITUDE MODULATED OSCILLATOR SYSTEMS

Filed Aug. 31, 1953 2 Sheets-Sheet 2

INVENTOR.
Hung C. Lin

BY H. W. Newton

ATTORNEY

United States Patent Office
2,886,653
Patented May 12, 1959

2,886,653

AMPLITUDE MODULATED OSCILLATOR SYSTEMS

Hung C. Lin, Levittown, Pa., assignor to Radio Corporation of America, a corporation of Delaware Application August 31, 1953, Serial No. 377,514
14 Claims. (Cl. 179—100.11)

This invention relates in general to amplitude modulated oscillator systems, and in particular to a modulated semi-conductor oscillator circuit for phonograph record reproduction systems and the like arranged to produce amplitude modulated carrier wave energy.

The input impedance of a transistor, as is well known, is generally relatively low. A crystal pickup for a phonograph, on the other hand, is a high impedance device. Thus, if it is desired to modulate a transistor oscillator from a phonograph crystal pickup, a transformer or some other impedance transformation device has been found necessary for proper matching of the transistor relatively low input impedance with the high impedance of the crystal pickup. Transformer coupling and other similar expedients are generally relatively costly and space consuming. Therefore, it is desirable to modulate a transistor oscillator directly from a crystal pickup, and accordingly, it is an object of the present invention to provide a semi-conductor oscillator circuit capable of being amplitude modulated directly from a high impedance source of modulating energy.

It is a further object of the present invention to provide a semi-conductor modulated oscillator circuit having a relatively high input impedance.

In most instances where it is desired to adapt a radio receiver for reproducing sound from a phonograph or otherwise amplifying audio frequency signals, the audio frequency signals are coupled with the input circuit of an audio frequency amplifying stage of the receiver. This method in some cases may not be desirable since the audio frequency amplification or gain of the receiver is insufficient to satisfactorily amplify the audio frequency oscillations developed in the phonograph pickup.

In accordance with the present invention, the disadvantage of gain in phonograph-radio combinations is avoided by converting either one of the intermediate frequency signal amplifying stages, the mixer stage or the local oscillator of a transistorized receiver into a transistor oscillator circuit which may directly be coupled with the phonograph crystal pickup for modulation purposes. At the same time, the use of additional switches for the purpose of changing the internal connections of the receiver when used for audio frequency amplification alone is avoided.

It is, accordingly, a still further object of the present invention to provide an improved radio receiver circuit employing transistors for high gain phonograph record translation and reproduction.

It is another object of the present invention to provide a radio-phonograph record translating and amplifying system employing semi-conductor devices which is stable and reliable in operation, low in cost and which employs a minimum number of circuit elements.

These and further objects of the present invention are achieved by raising the input or base impedance of a transistor, which is used as the amplifying element in a conventional transistor oscillator circuit, without the use of a transformer or other similar device. To this end, an impedance element which serves to degenerate the modulating or audio frequency signals is connected with the emitter of the transistor, thus raising the base input impedance. In addition, the transistor is biased for Class C operation, further increasing the base input impedance. An oscillator circuit of this type may be used, in accordance with the present invention, in a radio-phonograph combination or other record translating and reproducing systems.

The novel features that are considered characteristic of this invention are set forth with particularity in the appended claims. The invention itself, however, both as to its organization and method of operation, as well as additional objects and advantages thereof, will best be understood from a reading of the following description when read in connection with the accompanying drawings, in which:

Figure 1:
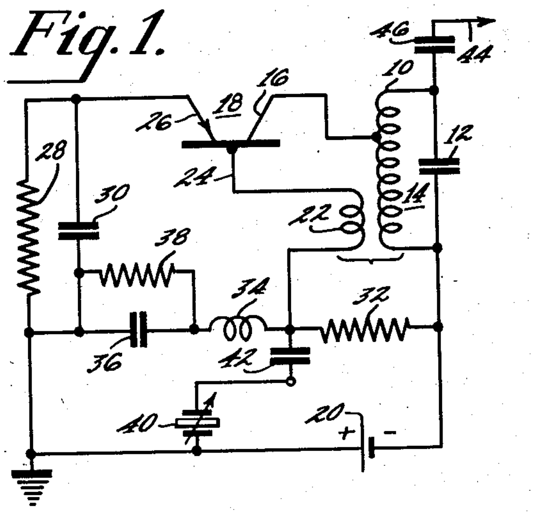
Figure 1 is a schematic circuit diagram of an amplitude modulated transistor oscillator circuit in accordance with the present invention.

Referring to the drawing, wherein like components are designated by the same reference numerals throughout the figures, and referring particularly to Figure 1, an inductor 10 and a capacitor 12 are arranged as a parallel resonant circuit 14 which is tuned to the center frequency of the energy to be generated and coupled to the collector 16 of a P–N–P junction transistor 18 which serves as the amplifying element of the oscillator circuit. To bias the collector and base electrodes in a relatively non-conducting or reverse direction, and the emitter and base in a relatively conducting or forward direction, a source of direct current operating bias may be provided, such as illustrated, by a battery 20 connected between one terminal of the parallel resonant circuit 14 and a point of fixed potential or ground for the system. It should be noted that the battery 20 is shown as properly poled for P–N–P junction transistors. Junction transistors of the N–P–N type may be utilized by reversing the polarity of the battery.

To provide the necessary feedback for oscillation, an inductor 22 is connected to the base 24 of transistor 18 and is inductively coupled to the inductor 10 of the parallel resonant circuit 14. The emitter 26 is connected through a suitable biasing resistor 28 to ground. In order to provide a low impedance oscillator frequency signal path, a capacitor 30 is connected from the emitter 26 in parallel with the biasing resistor 28. A further biasing resistor 32 is connected between the negative or ungrounded terminal of the battery 20 and the feedback inductor 22. A series tuned network comprising an inductor 34 and a capacitor 36 are connected from the junction of resistor 32 and the inductor 22 to the grounded end of the emitter biasing resistor 28. A biasing resistor 38 is connected from the junction of the inductor 34 and capacitor 36 to the end of bypass capacitor 30 remote from the emitter 26.

The source of modulation signal comprises a phonograph crystal pickup 40 which is connected from ground through a direct current blocking capacitor 42 to the junction of biasing resistor 32 and the inductor 34. Modulated output signals may be taken from the oscillator circuit from any suitable point, such as the high signal voltage end of the tuned circuit 14 through coupling means such as output lead 44 and a coupling capacitor 46.

As was explained hereinbefore, the input impedance of a transistor is relatively low, especially when compared with the relatively high impedance of a source of modulation signal such as the crystal pickup 40 of the present example. The present invention achieves proper impedance matching between a high impedance such as a crystal pickup and the relatively low input impedance of the transistor by effectively raising the input or base impedance of the transistor. To this end, the emitter biasing resistor 28 is so chosen that it presents a high impedance to audio frequency signals, or in other words, serves to degenerate audio frequency signals. This will, in effect, raise the base or input impedance of the transistor 18. At the same time, the biasing resistors 38 and 32 are so proportioned that the transistor is biased for Class C operation, that is, the transistor 18 is biased to "cut-off" or below. Thus, the base current is prevented from flowing during the major portion of the alternating current cycle which will make the input or base impedance of transistor 18 very high during the period when no base current is flowing.

The actual value of the Class C bias used depends upon the amplitude of the modulation signal and the point of cut-off desired. All the bias voltages also depend upon the particular operating characteristics of the transistors employed. Bias voltages may readily be adjusted to the desired value by observing the wave shape of a test voltage with a cathode ray oscilloscope, as is well known.

The by-pass capacitor 30 which shunts the emitter biasing resistor 28, provides a low impedance path to oscillator frequency signals, thereby preventing degeneration of those signals by resistor 28, but provides a high impedance to the audio frequency signals. A further low impedance oscillator frequency signal path is provided between the base 24 and ground by the series tuned circuit comprising the inductor 34 and the capacitor 36.

While it should be understood that the circuit specifications may vary according to the design for any particular application, the following circuit specifications are included by way of example only for the circuit illustrated in Figure 1:

| | |
|---|---|
| Resistor 28 and 38 | 2200 and 22,000 ohms, respectively. |
| Resistor 32 | 2.2 megohms. |
| Capacitors 12, 30 and 36 | 1500; 3300; and 1500 micromicrofarads, respectively. |
| Inductor 34 | 1.2 microhenries. |
| Battery 20 | 1.35 volts. |

The oscillator portion of the circuit illustrated in Figure 1 operates in the manner of a conventional junction transistor, that is, the parallel resonant circuit 14 comprising the inductor 10 and the capacitor 12 determines the operating frequency of the oscillator. Energy is fed back from the inductor 10 by means of the mutual coupling between it and the feedback inductor 22 to the base 24 of the transistor. This feedback energy is provided in phase and magnitude, through the coupling shown, to overcome the losses in the circuit and thereby sustain continuous oscillation. Amplitude modulation of the generated oscillator energy, as was explained hereinbefore, is produced by applying modulation signals from the crystal pickup 40 directly to the base 22.

Figure 2:
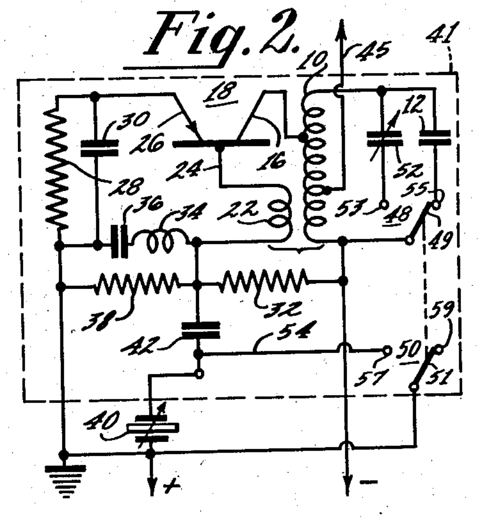
Figure 2 is a schematic circuit diagram of the local oscillator of a radio-phonograph combination employing transistors, further in accordance with the present invention.

In Figure 2, reference to which is now made, the local oscillator circuit of a radio receiver as shown, is modified, through suitable switching means, to include an oscillator circuit of the type illustrated in Figure 1 for phonograph operation. To this end, a pair of two terminal switches 48 and 50 are provided, each of which includes switch contacts 49, 51 and terminals 53, 55 and 57, 59, respectively, and which may be gang-connected for unitary operation as shown. A variable tuning capacitor 52 is connected from the high radio frequency voltage end of resonant circuit 14 to terminal 53 of the switch 48 and a lead 54 connects a corresponding terminal 57 of switch 50 to the ungrounded input terminal of the phonograph crystal pickup 40.

For phonograph operation, the oscillator circuit of Figure 2 operates in substantially the same manner as the oscillator circuit of Figure 1. In the switch position shown, the transistor 18 is modulated directly from the crystal pickup 40 and output signals are taken from any suitable point in the circuit, such as the high signal voltage end of the parallel resonant or tank circuit. This will provide phonograph operation, and as was explained in connection with Figure 1 the high impedance crystal pickup may be directly connected with the base 24. In actual practice, the frequency of oscillations for phonograph operation should be chosen to be equal to the intermediate frequency of the radio receiver. In this manner the modulated oscillator signal may be amplified by the intermediate frequency amplifiers of the receiver, detected, and then amplified by the audio frequency amplifiers in the well known manner.

For radio receiver operation, the switch contacts 49 and 51 of switches 48 and 50, respectively, are switched into their second alternative position to contact terminals 53 and 57, respectively. Accordingly, the variable capacitor 52 will be in circuit with the inductor 10 to form a parallel resonant circuit which may be tuned to the center frequency of the oscillator energy to be generated. The capacitor 12 will be open-circuited.

Figure 5:
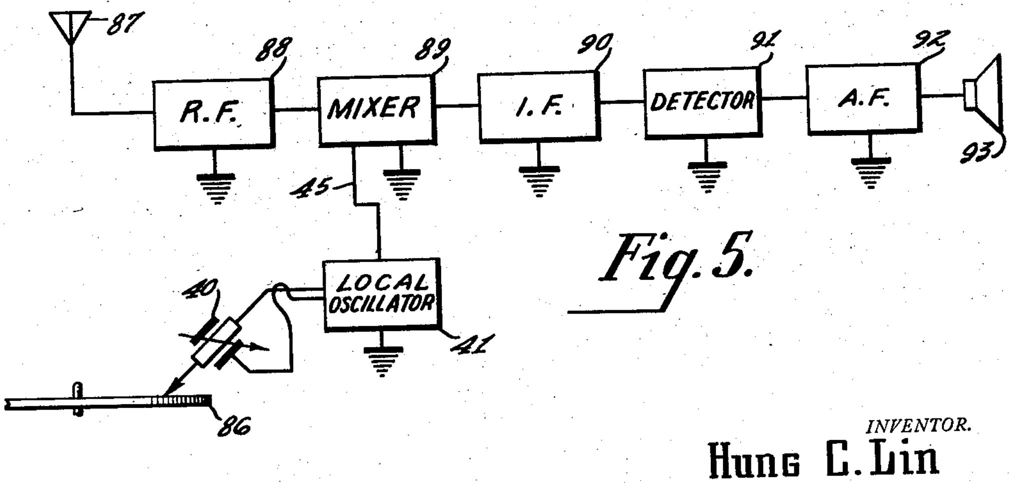
Figure 5 is a block diagram of a radio receiver illustrating the manner of application of the present invention thereto.

At the same time, the switch 50 will short circuit the crystal pickup 40, effectively removing it from the oscillator circuit. The oscillator will then oscillate in a manner similar to that described for phonograph operation, except of course, that modulation of the generated energy will not be present. The oscillator energy thus generated may be coupled from any convenient point in the circuit, as for example, from a tap 45 on the inductor 10 to the mixer of the receiver. This is shown in Figure 5 of the drawing wherein the local oscillator 41 of Figure 2 is connected for operation in a radio-phonograph combination which includes a phonograph turntable 86, the crystal pickup 40, an antenna 87, a radio-frequency amplifying stage 88, a signal mixer 89, an intermediate frequency amplifying stage 90, a second detector 91, an audio frequency amplifying stage 92 and a loudspeaker or other sound reproducing means 93. The receiver as shown is connected to be operative in accordance with well known superheterodyne principles. Thus, the oscillator signal is applied to the mixer 89 through the lead 45 where it is heterodyned with the received signal to produce a beat or intermediate frequency signal, whose frequency may be either the sum or the difference of the received signal and the oscillator signal. The intermediate frequency signal is then amplified by the intermediate frequency amplifying stage 90. The amplified intermediate frequency signals are then applied to the detector 91 where the received signal is separated from the modulation component. The resultant audio frequency signal is then amplified by the audio frequency amplifying stage 92 and applied to the loudspeaker 93 for reproduction.

Thus, the circuit illustrated in Figure 2 employs a minimum number of switches for radio-phonograph operation and by introducing the audio frequency signals from the phonograph pickup into the local oscillator circuit of the receiver, sufficient amplification thereof for most efficient operation is realized.

Figure 3:
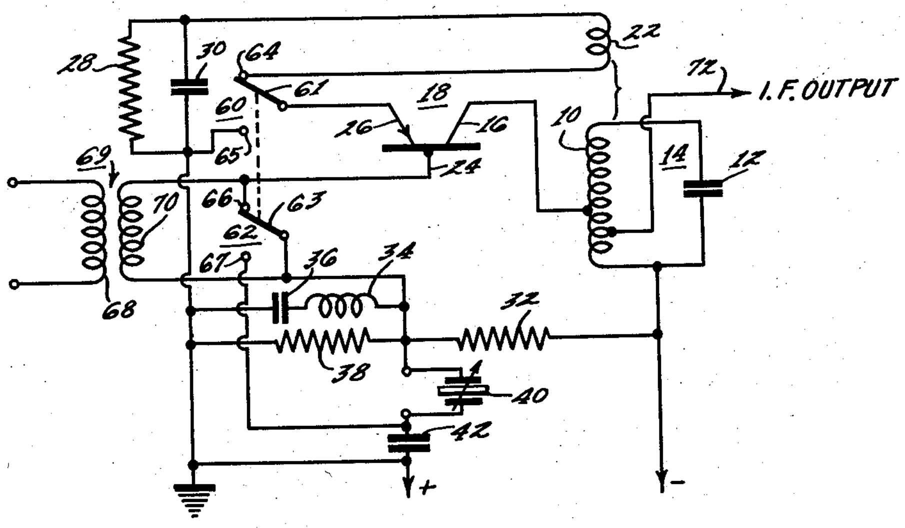
Figure 3 is a schematic circuit diagram of an intermediate frequency amplifying stage of a radio-phonograph combination illustrating a further embodiment of the present invention.

In Figure 3, an intermediate frequency amplifying stage of a radio receiver may be modified by suitable switching means, into a modulated oscillator circuit of the type illustrated in Figure 1 for phonograph operation. To this end, a pair of switches 60 and 62 may be provided having switch contacts 61 and 63 and contact terminals 64, 65 and 66, 67, respectively. In the switch position shown, the circuit is connected for phonograph operation, the feedback inductor feeding back energy from the tank circuit 14 of sufficient amplitude and proper phase to overcome circuit losses and sustain oscillation. In this switch position, the base 24 of the transistor 18 is directly connected with the crystal pickup 40 in a manner similar to that already described in connection with Figures 1 and 2.

For radio receiver operation, the tank or resonant circuit 14 serves as the tuned intermediate frequency output circuit. The frequency of oscillation is determined by the resonant frequency of resonant circuit 14, i.e., the frequency of the dial setting. To adapt the circuit for radio receiver operation, the switch contacts 61 and 63 are connected to the terminals 65 and 67, respectively. In this position, the crystal pickup 40 is short circuited and the intermediate frequency signals from the mixer stage or a previous intermediate frequency amplification stage are coupled from a primary winding 68 through a secondary winding 70 of a coupling transformer 69 to the base 24 of the transistor 18. At the same time, by virtue of the gang connection of switch contacts 61 and 63, the feedback circuit for phonograph operation comprising the feedback inductor 22, resistor 28 and capacitor 30 is open circuited. Accordingly, for a radio receiver operation, the transistor 18 is effectively connected for conventional transistor amplification action. Intermediate frequency output signals may be taken from any convenient point in the output circuit, such as illustrated, from an output lead 72 which is tapped down on the inductor 10 of tank circuit 14.

Figure 4:
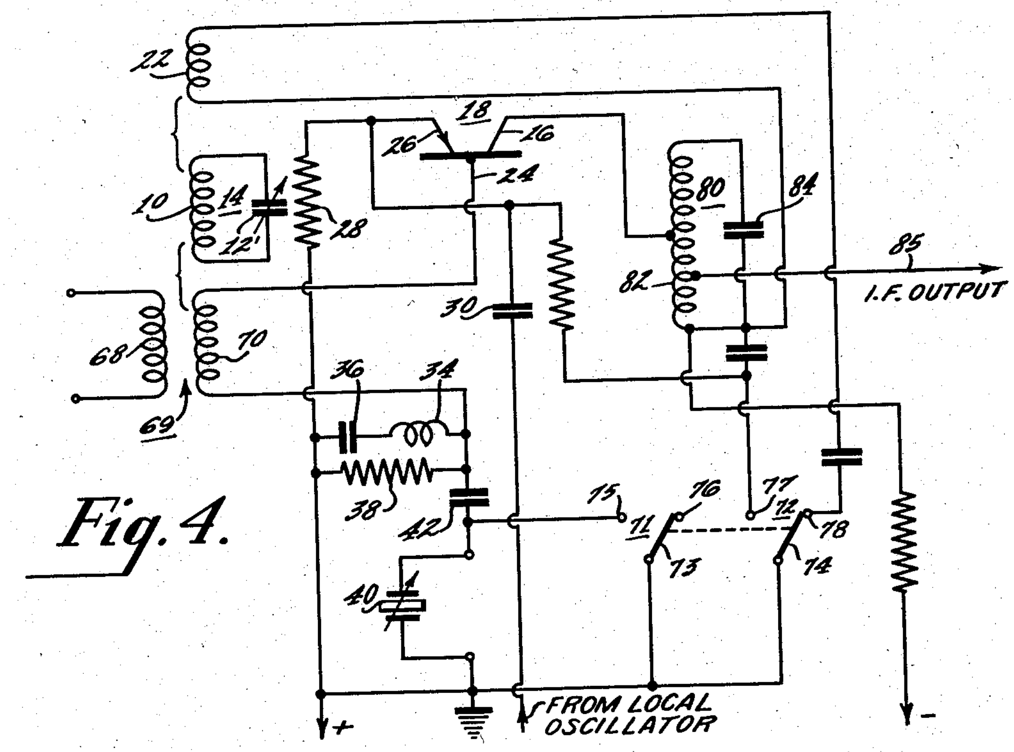
Figure 4 is a schematic circuit diagram of a mixer stage of a radio-phonograph combination illustrating a still further embodiment of the present invention.

Referring now to Figure 4, the mixer stage of a radio receiver is modified by simple switching means to include an oscillator circuit which may be directly modulated for phonograph operation in the same manner as described in connection with the preceding figures of the drawing. A pair of tuned parallel resonant circuits 14, 80 are provided. The tuned circuit 14, comprising inductor 10 and variable capacitor 12′, is normally tuned to the desired signal frequency when the receiver is used to receive a broadcast signal. The parallel resonant circuit 80 comprises an inductor 82 and a capacitor 84 and is normally tuned to the intermediate frequency of the receiver and serves as a tuned collector output circuit for the transistor 18. Intermediate frequency signals may be taken from any convenient point in the circuit as from an output lead 85, which is connected to a tap on the inductor 82 of the output resonant circuit 80.

A pair of switches 71, 72 include switch contacts 73, 74 and terminals 75, 76 and 77, 78, respectively. In the position shown, the mixer stage is connected for phonograph operation, the switch contact 73 being in contact with terminal 76 and the switch contact 74 being in contact with the terminal 78. Accordingly, energy is fed back from the collector 16 to the base and emitter by virtue of the inductive coupling between the feedback inductor 22, the inductor 10 of the parallel resonant circuit 14 and the input winding 70, of sufficient amplitude and proper phase to sustain oscillation. The oscillatory energy thus generated is modulated in amplitude by signals from the crystal pickup 40 which is directly connected with the base 24 through blocking capacitor 42 and the secondary winding 70 of input transformer 69. These modulated signals then beat with signals from the local oscillator of the receiver (not shown) whose output circuit is connected through the coupling capacitor 30 to the emitter 26 of transistor 18. Thus, an intermediate frequency signal is developed in the collector 16 and may be coupled from the output lead 85 to the intermediate frequency amplifying stages. Accordingly, the oscillatory signal which is modulated by the phonograph pickup 40 is subjected to superheterodyne action in the same manner as if it were a received signal.

For radio receiver operation, the switch contacts 73 and 74 are moved to connect with the terminals 75, 77, respectively. In this position the crystal pickup 40 is effectively short circuited or disconnected from the circuit while the feedback circuit, including the coupling inductor 22, is open circuited in a manner similar to that already described in connection with Figure 3. An incoming signal may be applied through the coupling transformer 69 including the tuned circuit 14, to the base 24 of transistor 18 where it beats with a local oscillator signal to produce a desired intermediate frequency signal. The resultant output intermediate frequency signal may be taken from the output lead 85 in the same manner as in phonograph operation.

As described herein, a high impedance modulating source may directly be connected with the input or base of the transistor amplifying element of an oscillator circuit, thus eliminating costly impedance transformation equipment. In addition, either the local oscillator, mixer, or one of the intermediate frequency amplifying stages of a superheterodyne radio receiver may be modified to include a circuit of this type for radio-phonograph operation. In addition to these advantages, the phonograph signals are provided with adequate amplification for satisfactory reproduction. It is also apparent that since either the local oscillator, intermediate frequency, or mixer stages of a radio receiver may be used for phonograph operation, the receiver automatic volume control system will also be effective for phonograph operation.

What is claimed is:

1. The combination with a semi-conductor oscillator circuit including a semi-conductor device having collector, emitter and base electrodes in contact therewith, of a high impedance source of modulating signals coupled with said base electrode, energizing means including a source of potential for applying energizing potentials to each of said electrodes, means for biasing said device below base current cut-off to provide Class C operation, and impedance means having a relatively high impedance to said modulating signals connected to said emitter electrode to increase the base impedance of said device whereby the base impedance of said device is substantially equal the impedance of said source.

2. A semi-conductor amplitude-modulated oscillator circuit comprising in combination, a semi-conductor device having collector, emitter and base electrodes in contact therewith, a high impedance source of audio frequency modulating signals coupled with said base electrode, biasing means including a source of potential for applying a potential in the forward direction between said emitter and base electrodes and in the reverse direction between said collector and base electrodes to bias said device below base current cutoff for Class C operation of said device thereby to increase the impedance of said base electrode, and a resistor connected to said emitter electrode having a resistance value to degenerate said audio frequency signals and further increase the base impedance of said device to substantially equal the impedance of said source.

3. In an electrical signal conveying circuit, the combination comprising, a semi-conductor device having a semi-conductive body, and a collector, an emitter and a base electrode in contact therewith, energizing means including a source of potential for applying energizing potentials to each of said electrodes of a magnitude to bias said device below base current cutoff to provide Class C operation of said device, an output circuit coupled with said collector electrode, feedback means for said device including a parallel resonant tank circuit and an inductor, a high impedance source of modulating signals, and a first and a second switching means ganged for simultaneous operation and operative respectively to open circuit said feedback means and short circuit said high impedance source in one position and to connect said feedback means and said high impedance source in circuit with said device in a second position.

4. In a radio receiving system, the combination comprising, an oscillator circuit including a semi-conductor device having a collector, an emitter and a base electrode in contact therewith, a signal selective parallel resonant circuit, a first switching means for connecting said signal selective circuit with said collector electrode, energizing means including a source of potential for applying energizing potentials to each of said electrodes of a magnitude to bias said device below base current cutoff to provide Class C operation of said device, a high impedance source of modulating signals, a second switching means ganged with said first switching means and operative to connect said source of modulating signals in circuit with said base electrode to modulate said oscillator circuit in response to modulating signals from said source, and an impedance element connected to said emitter electrode having a relatively high impedance to said modulating signals of a value to increase the impedance of said base electrode to a predetermined value essentially matching said modulating signal source.

5. In a radio receiver the combination comprising, an oscillator circuit including a semi-conductor device having a collector, an emitter and a base electrode in contact therewith, feedback means including a first inductor coupled with said collector electrode and a second inductor coupled with said base electrode, a first switching means coupled with the low signal voltage end of said first inductor and including a pair of switch terminals, a variable capacitor connected from the high signal voltage end of said first inductor to one of said terminals, a further capacitor connected from the junction of said variable capacitor and said first inductor to the other of said terminals, said switch means being operative alternately to connect said capacitors with said first inductor to provide a frequency selective parallel resonant circuit, energizing means including a source of potential for applying energizing potentials to each of said electrodes of a magnitude to bias said device below base current cutoff to provide Class C operation of said device, a high impedance modulating signal supply circuit, a second switching means ganged with said first switching means and operative to connect said modulating signal supply circuit with said base electrode whereby modulating signals are applied to said oscillator circuit, and an impedance element coupled with said emitter electrode having a high impedance to said modulating signals thereby to increase the impedance of said base electrode.

6. The combination as defined by claim 5 wherein said second switching means effectively short circuits said source of modulating signals when said first switching means is operative to connect said first capacitor in circuit with said first inductor.

7. The combination as defined by claim 6 wherein said high impedance source of modulating signals is a phonograph pickup circuit.

8. In combination with a semi-conductor oscillator circuit adapted to be amplitude modulated from a high impedance source of audio frequency modulating signals, a semi-conductor device having an emitter, a collector and a base electrode, means connecting said source in circuit with said base electrode, means for applying a potential in the forward direction between said emitter and base electrodes and in the reverse direction between said collector and base electrodes to bias said device below base current cutoff to provide for Class C operation of said device thereby to increase the input impedance of said device, and a resistor having a high impedance to said audio frequency signals connected to said emitter electrode, said resistor being effective to further increase the impedance of said base electrode wherein it is substantially equal to the impedance of said source of modulating signals.

9. In a signal conveying system the combination comprising, a semi-conductor device having a collector, an emitter and a base electrode in contact therewith, energizing means including a source of potential for applying energizing potentials to each of said electrodes of a magnitude to bias said device below base current cutoff and provide Class C operation of said device, a tunable signal selecting circuit coupled with said collector electrode, a first two-position switching means connected with said emitter electrode and including a pair of switch terminals, a feedback inductor and an impedance element having a high impedance to signals of predetermined frequency coupled between said terminals, a high impedance supply circuit for modulating signals, a second two-position switching means ganged with said first switching means and operative therewith in a first position jointly to connect said modulating signal supply circuit directly with said base electrode and to connect said feedback inductor and impedance element in circuit with said emitter electrode whereby said device is modulated in response to signals from said modulation signal supply circuit, and said switching means being operative in a second position jointly to short-circuit said source and to open circuit said feedback inductor and impedance element.

10. In a system as defined by claim 9 wherein said source of modulating signals is a phonograph pickup device and said system is operative as phonograph record reproducing means in said first position as radio signal receiving means in said second position of said switching means.

11. In a radio-phonograph system, the combination of a semi-conductor device having a collector, an emitter and a base electrode in contact therewith, energizing means including a source of potential for applying energizing potentials to each of said electrodes of a magnitude to bias said device below base current cutoff to provide Class C operation of said device, a tunable signal circuit coupled with said collector electrode, a first two-position switching means connected with said emitter electrode and including a pair of switch terminals, feedback means coupled between said terminals, a high impedance modulating signal supply circuit including a phonograph pickup device, a second two-position switching means ganged with said first switching means and operative therewith in a first position jointly to connect said modulating signal supply circuit directly with said base electrode and to connect said feedback inductor and impedance element in circuit with said emitter electrode, whereby said semi-conductor device is modulated by signals from said pickup device for phonograph operation, and said switching means being operative in a second position jointly to short-circuit said supply circuit and to open-circuit said feedback inductor and impedance element for radio receiver operation.

12. The combination with a semi-conductor oscillator circuit including a semi-conductor device having collector, emitter and base electrodes in contact therewith, means for applying modulating signals to said device including a high impedance phonograph pickup device coupled with said base electrode, biasing means including a source of potential for applying energizing potentials to each of said electrodes to bias said device below base current cutoff providing Class C operation of said device, and an impedance element having an impedance value of a magnitude to degenerate said audio frequency signals connected to said emitter electrode and to increase the base impedance of said device to substantially equal the impedance of said phonograph pickup device.

13. In a signal conveying circuit, the combination comprising, a semi-conductor device having a semiconductive body, and a collector, an emitter and a base electrode in contact therewith, energizing means including a source of potential for applying energizing potentials to each of said electrodes of a magnitude to bias said device below base current cutoff to provide Class C operation of said device, a signal selective output circuit coupled with said collector electrode, feedback means for said device including a parallel resonant tank circuit and an inductor connected in circuit with said collector electrode, a high impedance modulating signal supply circuit, first and second ganged switching means operative respectively to open-circuit said feedback means and to short-circuit said modulating signal supply circuit in a first position, and to connect said feedback means and said modulating signal supply circuit in circuit with said device in a second position, and means coupling a source of local oscillations with said base electrode.

14. A radio-phonograph system operative to heterodyne radio frequency signals for radio receiver operation and to provide modulated oscillator signals for phonograph operation, comprising in combination, a semi-conductor device having a semi-conductive body, and a collector, an emitter and a base electrode in contact therewith, energizing means including a source of potential for applying energizing potentials to each of said electrodes of a magnitude to bias said device below base current cutoff to provide Class C operation of said device, a signal selective output circuit coupled with said collector electrode, feedback means for said device including a parallel resonant tank circuit and an inductor connected in circuit with said collector electrode, a modulating signal supply circuit, means coupling a local oscillator circuit with said base electrode, and a first and a second switching means ganged simultaneous operation to respectively open-circuit said feedback means and short-circuit said modulating signal supply circuit for radio operation, and to connect said feedback means and said modulating signal supply circuit in circuit with said device for phonograph operation.

References Cited in the file of this patent

UNITED STATES PATENTS

| | | |
|---|---|---|
| 2,047,726 | Di Renzo | July 14, 1936 |
| 2,436,946 | Tatro | Mar. 2, 1948 |
| 2,505,655 | Van Weel | Apr. 25, 1950 |
| 2,548,531 | Hayes | Apr. 10, 1951 |
| 2,556,296 | Meacham | June 12, 1951 |
| 2,570,436 | Eberhard et al. | Oct. 9, 1951 |
| 2,657,360 | Wallace | Oct. 27, 1953 |
| 2,757,243 | Thomas | July 31, 1956 |